US012584787B2

(12) United States Patent      (10) Patent No.:   US 12,584,787 B2
Sasaki et al.      (45) Date of Patent:    Mar. 24, 2026

(54) ULTRASONIC SENSOR AND METHOD FOR MANUFACTURING ULTRASONIC SENSOR

(71) Applicant: SEIKO EPSON CORPORATION, Tokyo (JP)

(72) Inventors: Mio Sasaki, Shiojiri (JP); Chikara Kojima, Matsumoto (JP); Seiji Izuo, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 352 days.

(21) Appl. No.: 18/192,173

(22) Filed: Mar. 29, 2023

(65) Prior Publication Data

US 2023/0314208 A1     Oct. 5, 2023

(30) Foreign Application Priority Data

Mar. 30, 2022    (JP) ................................. 2022-056225

(51) Int. Cl.
     *G01H 11/08*      (2006.01)
     *H10N 30/01*      (2023.01)
     (Continued)

(52) U.S. Cl.
     CPC ............. *G01H 11/08* (2013.01); *H10N 30/02* (2023.02); *H10N 30/302* (2023.02); *H10N 30/01* (2023.02);
     (Continued)

(58) Field of Classification Search
     CPC ...... G01H 11/08; H10N 30/02; H10N 30/302; H10N 30/01; H10N 30/2047; H10N 30/308
     See application file for complete search history.

(56) References Cited

U.S. PATENT DOCUMENTS

2015/0258573 A1    9/2015   Kojima
2016/0058417 A1    3/2016   Kiyose et al.
(Continued)

FOREIGN PATENT DOCUMENTS

EP      2886210 A2    6/2015
JP     2010018437 A    1/2010
(Continued)

OTHER PUBLICATIONS

Office Action for JP Patent Application No. 2022056225, issued on Nov. 18, 2025, 7 pages.

*Primary Examiner* — Peter J Macchiarolo
*Assistant Examiner* — John M Royston
(74) *Attorney, Agent, or Firm* — CHIP LAW GROUP

(57)      ABSTRACT

An ultrasonic sensor includes: a substrate having a first surface and a second surface at an opposite side from the first surface, the substrate having an opening penetrating the substrate from the first surface to the second surface; a vibration plate covering a first surface side of the opening; piezoelectric elements provided at a surface of the vibration plate at an opposite side from the opening and each including a first electrode, a piezoelectric layer, and a second electrode; and an elastic layer in contact with the vibration plate in the opening, in which a portion in which the first electrode, the piezoelectric layer, and the second electrode overlap is defined as an active portion, and a plurality of the active portions face the one opening, and a thickness of the elastic layer is equal to or larger than half a thickness of the substrate and less than the thickness of the substrate, and the thickness of the elastic layer in each of the active portions is uniform.

7 Claims, 6 Drawing Sheets

(51) Int. Cl.
      *H10N 30/02*       (2023.01)
      *H10N 30/20*       (2023.01)
      *H10N 30/30*       (2023.01)
(52) U.S. Cl.
      CPC ....... *H10N 30/2047* (2023.02); *H10N 30/308*
                                                    (2023.02)

(56)                    References Cited

U.S. PATENT DOCUMENTS

| | | |
|---|---|---|
| 2020/0049806 A1 | 2/2020 | Ohashi |
| 2020/0152857 A1 | 5/2020 | Ohashi et al. |
| 2022/0160331 A1* | 5/2022 | Ohashi ................. A61B 8/4427 |

FOREIGN PATENT DOCUMENTS

| | | |
|---|---|---|
| JP | 2015188208 A | 10/2015 |
| JP | 2016049193 A | 4/2016 |
| JP | 2020027953 A | 2/2020 |
| JP | 2020080497 A | 5/2020 |

* cited by examiner

FIG. 4

ULTRASONIC SENSOR AND METHOD FOR MANUFACTURING ULTRASONIC SENSOR

The present application is based on, and claims priority from JP Application Serial Number 2022-056225, filed Mar. 30, 2022, the disclosure of which is hereby incorporated by reference herein in its entirety.

BACKGROUND

1. Technical Field

The present disclosure relates to an ultrasonic sensor and a method for manufacturing an ultrasonic sensor.

2. Related Art

In the related art, an ultrasonic sensor which transmits ultrasonic waves by vibrating a vibration plate is known (see, for example, JP-A-2020-80497 and JP-A-2015-188208).

In the ultrasonic sensor disclosed in JP-A-2020-80497, an opening is provided in a substrate, the vibration plate is provided at an opposite side from an opening end of the opening, and a piezoelectric element is provided at a surface of the vibration plate opposite from the opening. An elastic layer is provided in the opening, and a surface of the elastic layer is curved so that an ultrasonic wave incident from an opening end side is refracted by the curved surface and is input to a position of the piezoelectric element.

In the ultrasonic sensor disclosed in JP-A-2015-188208, an opening is provided in a substrate, and the vibration plate is provided at an opposite side from an opening end of the opening. The opening is formed in a longitudinal shape in which a length in a Y direction is considerably longer than a length in an X direction, where a direction orthogonal to a thickness direction (Z direction) of the substrate is the X direction, and a direction orthogonal to the X direction and the Z direction is the Y direction. At the vibration plate, a plurality of piezoelectric elements are arranged along the Y direction, and partition walls extending in the X direction are provided between the piezoelectric elements. Accordingly, the vibration plate is divided into a plurality of active portions surrounded by an end edge of the opening along the Y direction and end edges of the partition walls along the X direction, and the piezoelectric elements are disposed in the regions.

When one piezoelectric element is disposed for one opening as in JP-A-2020-80497, the curved surface of the elastic layer is not a major problem. In contrast, when the opening is formed in the longitudinal shape and a plurality of piezoelectric elements are arranged along a longitudinal direction as in JP-A-2015-188208, thicknesses of the elastic layer vary at positions facing the piezoelectric elements when the elastic layer having the curved surface as in JP-A-2020-80497 is formed. In this case, variation occurs in a resonance frequency in each of the active portions, and as a result, transmission and reception sensitivity of the ultrasonic sensor decreases.

SUMMARY

An ultrasonic sensor according to a first aspect of the present disclosure includes: a substrate having a first surface and a second surface at an opposite side from the first surface, the substrate having an opening extending from the first surface to the second surface; a vibration plate closing a first surface side of the opening; piezoelectric elements provided at a surface of the vibration plate at an opposite side from the opening and each including a first electrode, a piezoelectric layer, and a second electrode which are stacked; and an elastic layer in contact with the vibration plate in the opening, in which a direction in which the first electrode, the piezoelectric layer, and the second electrode are stacked is defined as a stacking direction, and a portion in which the first electrode, the piezoelectric layer, and the second electrode overlap in a plan view seen from the stacking direction is defined as an active portion, and a plurality of the active portions face the one opening, a reduction portion configured to reduce vibration of the vibration plate is provided at the surface of the vibration plate at the opposite side from the opening between adjacent active portions, and a thickness of the elastic layer is equal to or larger than half a thickness of the substrate and less than the thickness of the substrate, and the thickness of the elastic layer in each of the active portions is uniform when viewed from a direction orthogonal to the stacking direction.

A method for manufacturing an ultrasonic sensor according to a second aspect of the present disclosure is a method for manufacturing an ultrasonic sensor, the ultrasonic sensor including a substrate having a first surface and a second surface at an opposite side from the first surface, the substrate having an opening extending from the first surface to the second surface, a vibration plate closing a first surface side of the opening, piezoelectric elements provided at a surface of the vibration plate at an opposite side from the opening and each including a first electrode, a piezoelectric layer, and a second electrode which are stacked, and an elastic layer in contact with the vibration plate in the opening, in which a direction in which the first electrode, the piezoelectric layer, and the second electrode are stacked is defined as a stacking direction, and a portion in which the first electrode, the piezoelectric layer, and the second electrode overlap in a plan view seen from the stacking direction is defined as an active portion, and a plurality of the active portions face the one opening, a reduction portion configured to reduce vibration of the vibration plate is provided at the surface of the vibration plate at the opposite side from the opening between adjacent active portions, and a thickness of the elastic layer is equal to or larger than half a thickness of the substrate and less than the thickness of the substrate, and the thickness of the elastic layer in each of the active portions is uniform when viewed from a direction orthogonal to the stacking direction. The method for manufacturing an ultrasonic sensor includes: injecting a resin material for forming the elastic layer into the opening of the substrate at which the vibration plate is provided at the first surface; bringing a spatula member having a leveling surface parallel to the second surface into contact with the second surface; and reciprocating the spatula member along the second surface at a predetermined constant speed.

BRIEF DESCRIPTION OF THE DRAWINGS

FIG. 4 is a diagram showing a method for manufacturing the ultrasonic sensor according to the embodiment.

DESCRIPTION OF EXEMPLARY EMBODIMENTS

An ultrasonic sensor according to the embodiment will be described below.

Figure 1:
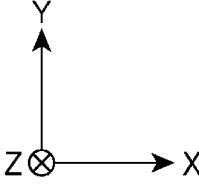
FIG. 1 is a schematic plan view of an ultrasonic sensor according to the embodiment.
Figure 2:
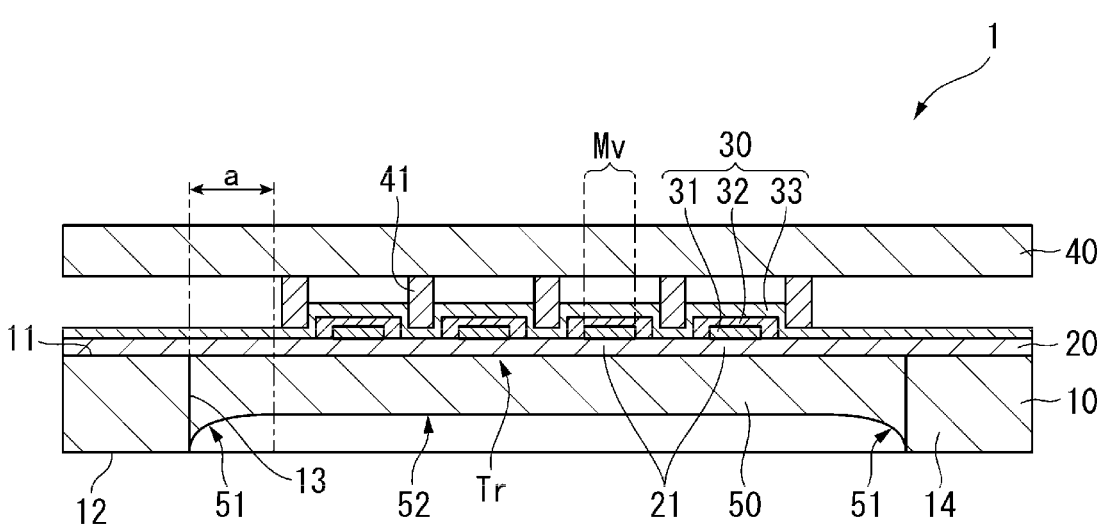
FIG. 2 is a schematic cross-sectional view of the ultrasonic sensor taken along a line A-A in FIG. 1.
Figure 2:
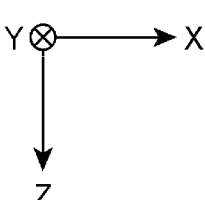

FIG. 1 is a schematic plan view of the ultrasonic sensor according to the embodiment. FIG. 2 is a schematic cross-sectional view of the ultrasonic sensor taken along a line A-A in FIG. 1.

As shown in FIG. 2, an ultrasonic sensor 1 according to the embodiment includes a substrate 10, a vibration plate 20, piezoelectric elements 30, a sealing plate 40, and an elastic layer 50.

Here, a thickness direction of the substrate 10 is defined as a Z direction, a direction orthogonal to the Z direction is defined as an X direction (first direction), and a direction orthogonal to the Z direction and the X direction is defined as a Y direction (second direction). The Z direction is a stacking direction of a first electrode 31, a piezoelectric layer 32, and a second electrode 33 constituting each of the piezoelectric elements 30.

The substrate 10 is formed of, for example, a semiconductor substrate made of Si. The substrate 10 is a plate-shaped member having a first surface 11 and a second surface 12 at an opposite side from the first surface 11. A distance (thickness) from the first surface 11 to the second surface 12 is uniform. The thickness of the substrate 10 is 20 μm or more and 200 μm or less.

The substrate 10 is provided with an opening 13 extending from the first surface 11 to the second surface 12. In the embodiment, the opening 13 is long along the X direction, with a length along the X direction larger than a length along the Y direction in a plan view from the Z direction. The length of the opening 13 in the X direction and the length of the opening 13 in the Y direction may be the same, or the length of the opening 13 in the Y direction may be longer than that of the length of the opening 13 in the X direction. In FIG. 1, only one opening 13 is provided in the substrate 10, but a plurality of openings 13 may be provided. For example, a plurality of openings 13 may be provided along the Y direction.

In the embodiment, the vibration plate 20 is provided at the first surface 11 of the substrate 10, and the opening 13 at the first surface 11 is closed by the vibration plate 20. A portion of the substrate 10 to which the vibration plate 20 is bonded is a wall portion 14. The opening 13 is formed by being surrounded in four directions (±X sides, ±Y sides) by the wall portion 14.

The elastic layer 50 is formed in the opening 13. The elastic layer 50 will be described later.

The vibration plate 20 is made of, for example, SiO₂ or a stacking body of SiO₂ and ZrO₂. As described above, the vibration plate 20 is supported by the wall portion 14 at the first surface 11 of the substrate 10 to close the opening 13. A thickness of the vibration plate 20 is sufficiently smaller than that of the substrate 10.

The sealing plate 40 is disposed at a side of the vibration plate 20 opposite from the substrate 10 and faces the vibration plate 20.

As will be described in detail later, the sealing plate 40 is bonded to the vibration plate 20 via partition walls 41 (a reduction portion according to the present disclosure). These partition walls 41 include a plurality of X-divided partition walls 41X extending along the Y direction and provided at equal intervals in the X direction and a plurality of Y-divided partition walls 41Y extending along the X direction and provided at equal intervals in the Y direction in the plan view.

A region surrounded at four sides by edges of the partition walls 41 in the vibration plate 20 constitutes flexible portions 21. In the embodiment, a plurality of flexible portions 21 are arranged in the X direction and the Y direction with respect to one opening 13. The piezoelectric elements 30 are respectively provided on the flexible portions 21.

As described above, the piezoelectric element 30 is provided at a surface of the flexible portion 21 at a sealing plate 40 side (an opposite side from the substrate 10). The piezoelectric element 30 is implemented by stacking the first electrode 31, the piezoelectric layer 32, and the second electrode 33 from a vibration plate 20 side toward a −Z side. In the following description, a portion where the first electrode 31, the piezoelectric layer 32, and the second electrode 33 completely overlap in the plan view is referred to as an active portion Mv.

Specific electrode shapes of the first electrode 31 and the second electrode 33 are not particularly limited.

For example, in the embodiment, in the plan view, the first electrode 31 is formed linearly along the Y direction, and the second electrode 33 is formed linearly along the X direction. The first electrode 31 and the second electrode 33 extend to a coupling region (not shown) provided at an outer peripheral portion of the vibration plate 20, and are electrically coupled to a drive control circuit (not shown) in the coupling region.

Either the first electrode 31 or the second electrode 33 may be wired to the other on the vibration plate 20 as a common electrode and extend to the coupling region. In this case, a control circuit unit sets a predetermined reference potential to the one of the first electrode 31 and the second electrode 33 which is the common electrode, and applies a drive signal to the other of the first electrode 31 and the second electrode 33.

A material for the first electrode 31 and the second electrode 33 is not particularly limited as long as the first electrode 31 and the second electrode 33 have conductivity. Examples of the material for the first electrode 31 and the second electrode 33 include a metal material such as platinum (Pt), iridium (Ir), gold (Au), aluminum (Al), copper (Cu), titanium (Ti), and stainless steel, a tin oxide-based conductive material such as an indium tin oxide (ITO) and a fluorine-doped tin oxide (FTO), a zinc oxide-based conductive material, an oxide conductive material such as strontium ruthenate (SrRuO₃), lanthanum nickelate (LaNiO₃), and element-doped strontium titanate, and a conductive polymer.

The piezoelectric layer 32 can typically be made of a lead zirconate titanate (PZT)-based complex oxide having a perovskite structure. Accordingly, it is easy to secure a displacement amount of the piezoelectric element 30. As the piezoelectric layer 32, another complex oxide having a perovskite structure which does not contain lead may be used, and in this case, the ultrasonic sensor 1 can be implemented by using a non-lead-based material having a low load on the environment.

One flexible portion 21 and the piezoelectric element 30 on the flexible portion 21 constitute one ultrasonic transducer Tr. In such an ultrasonic transducer Tr, when a rectangular wave voltage (drive signal) having a predetermined frequency is applied between the first electrode 31 and the second electrode 33, the piezoelectric layer 32 bends, the flexible portion 21 vibrates, and an ultrasonic wave is transmitted. When the flexible portion 21 vibrates due to an ultrasonic wave incident from an opening 13 side, a potential difference is generated between upper and lower portions of the piezoelectric layer 32. Accordingly, reception of the ultrasonic wave can be detected by detecting a potential difference generated between the first electrode 31 and the second electrode 33.

The sealing plate 40 faces the vibration plate 20 and has a thickness sufficiently larger than that of the vibration plate 20. A material for the sealing plate 40 and the thickness of the sealing plate 40 are preferably set based on a center frequency of ultrasonic waves to be transmitted and received by the ultrasonic transducer.

Each of the partition walls 41 is bonded to the sealing plate 40, thereby making it possible to reduce vibration of the vibration plate 20. That is, vibration of a portion of the vibration plate 20 to which the partition wall 41 is bonded is restricted by the sealing plate 40, and the flexible portion 21 of the vibration plate 20 surrounded by the partition wall 41 is vibrated by driving of the piezoelectric element 30.

The elastic layer 50 is in contact with the vibration plate 20 in the opening 13 of the substrate 10. The elastic layer 50 is made of an elastic material such as resin, for example, and reduces vibration of the vibration plate 20, thereby reducing vibration of the flexible portion 21 from being propagated between adjacent ultrasonic transducers Tr. Although details of a thickness of the elastic layer 50 will be described later, the elastic layer 50 is formed such that the thickness of the elastic layer 50 facing each active portion Mv is uniform. That is, a surface of the elastic layer 50 at an opposite side from the vibration plate 20 is the same plane. As described above, the thickness of the substrate 10 is set to 20 μm or more and 200 μm or less, and the thickness of the elastic layer 50 facing each active portion Mv is equal to or larger than half the thickness of the substrate 10 and less than the thickness of the substrate 10. For example, when the thickness of the substrate 10 is 70 μm, the thickness of the elastic layer 50 is 35 μm or more and less than 70 μm.

Next, an arrangement position of the ultrasonic transducers Tr in the opening 13 and the thickness of the elastic layer 50 in the ultrasonic sensor 1 as described above will be described in more detail.

In the ultrasonic sensor 1 according to the embodiment, the ultrasonic transducers Tr are arranged in a central portion of the opening 13 in the plan view viewed from the Z direction.

That is, as shown in FIG. 1, the elastic layer 50 provided in the opening 13 includes an outer peripheral edge portion 51 from an opening end edge 131 of the opening 13 to a position having a predetermined dimension a, and a central portion 52 provided at a side (inner side) farther from the opening end edge 131 than the outer peripheral edge portion 51. The dimension a of the outer peripheral edge portion 51 from the opening end edge 131 is, for example, 1 mm, and in this portion, the elastic layer 50 creeps up along the wall portion 14 for the opening 13, so that the surface of the elastic layer 50 at the opposite side from the vibration plate 20 is inclined with respect to an XY plane and becomes a curved surface.

On the other hand, the central portion 52 of the elastic layer 50 has a uniform thickness, that is, the central portion 52 is formed such that the thickness at the opposite side from the vibration plate 20 is at the same plane parallel to the first surface 11 of the substrate 10.

In the embodiment, the active portions Mv and the ultrasonic transducers Tr are disposed at a position overlapping the central portion 52 in the plan view. Here, a total area of the active portions Mv in the plan view is smaller than an area of the opening 13 and occupies 60% to 80% of the area of the opening 13. For example, when a shape of the opening end edge 131 of the opening 13 is a rectangular shape of 14 mm×20 mm in the plan view, and the outer peripheral edge portion 51 has a width range of 1 mm from the opening end edge 131, the central portion 52 has a size of 12 mm×18 mm. In this case, an opening area of the opening 13 is 280 mm², and an area of the central portion 52 is 216 mm², so the area of the central portion 52 is approximately 77% of the area of the opening 13. When six active portions Mv, which are square in shape and have a side of 5 mm in the plan view, are arranged in a 2×3 array in the central portion 52, a total area thereof is 150 mm², which occupies 53% of the area of the opening 13.

In the embodiment, as described above, the thickness of the elastic layer 50 facing each active portion Mv in the central portion 52 is equal to or larger than half the thickness of the substrate 10 and less than the thickness of the substrate 10.

Figure 3:
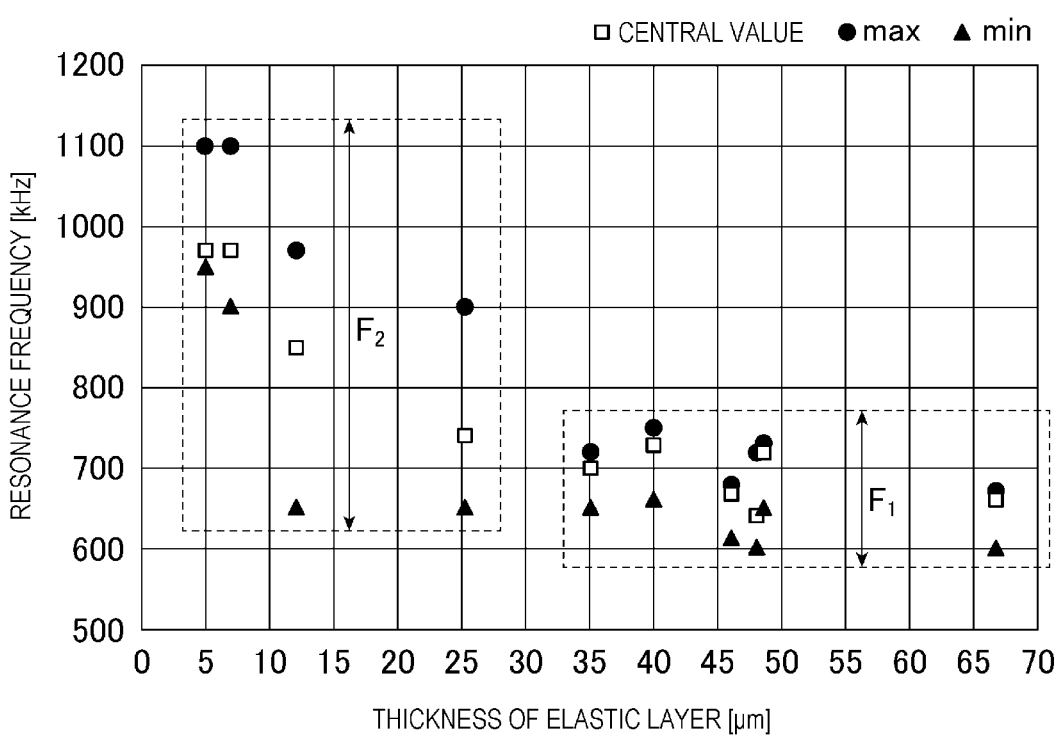
FIG. 3 is a diagram showing resonance frequencies of an ultrasonic transducer when a thickness of an elastic layer is changed in the embodiment.

FIG. 3 is a diagram showing resonance frequencies of the ultrasonic transducer Tr when the thickness of the elastic layer 50 is changed when the thickness of the substrate 10 is 70 μm in the embodiment. The thickness of the elastic layer 50 here is a thickness at the central portion 52, and a measurement result of the resonance frequencies of the ultrasonic transducer Tr disposed at a center point of the central portion 52 is indicated As shown in FIG. 3, when the thickness of the elastic layer 50 at the central portion 52 is less than half the thickness of the substrate 10, a difference between a maximum value and a minimum value of the resonance frequency is large as shown in FIG. 3. For example, in the example shown in FIG. 3, the resonance frequency varies within a range $F_2$ from about 600 kHz to about 1100 kHz. Therefore, when an ultrasonic wave is output from the ultrasonic sensor 1, a frequency of the ultrasonic wave output from the ultrasonic transducer Tr varies. When an ultrasonic wave is received by the ultrasonic sensor 1, the ultrasonic sensor 1 includes an ultrasonic transducer Tr having a large received signal and an ultrasonic transducer Tr having a small received signal even though the same ultrasonic wave is received. Therefore, transmission and reception sensitivity for the ultrasonic wave in the ultrasonic sensor 1 deteriorates. When the thickness of the elastic layer 50 is 5 μm, variation in the resonance frequency is small, indicating that the thickness of the elastic layer 50 is too small to be effective in reducing vibration.

In contrast, when the thickness of the elastic layer 50 in the central portion 52 is equal to or larger than half the thickness of the substrate 10, a difference between a maximum value and a minimum value of the resonance frequency becomes small, and for example, in the example of FIG. 3, variation in the resonance frequency falls within a range $F_1$ from about 600 kHz to about 750 kHz. Therefore, when ultrasonic waves are output from the ultrasonic sensor 1, ultrasonic waves having a uniform frequency can be output from individual ultrasonic transducers Tr. When receiving ultrasonic waves, uniform received signals can be output from individual ultrasonic transducers Tr when receiving ultrasonic waves having the same frequency and the same sound pressure. Therefore, it is possible to improve the transmission and reception sensitivity for the ultrasonic wave in the ultrasonic sensor 1.

Method for Manufacturing Ultrasonic Sensor 1

A method for manufacturing the ultrasonic sensor 1 as described above will be described.

Figure 4:
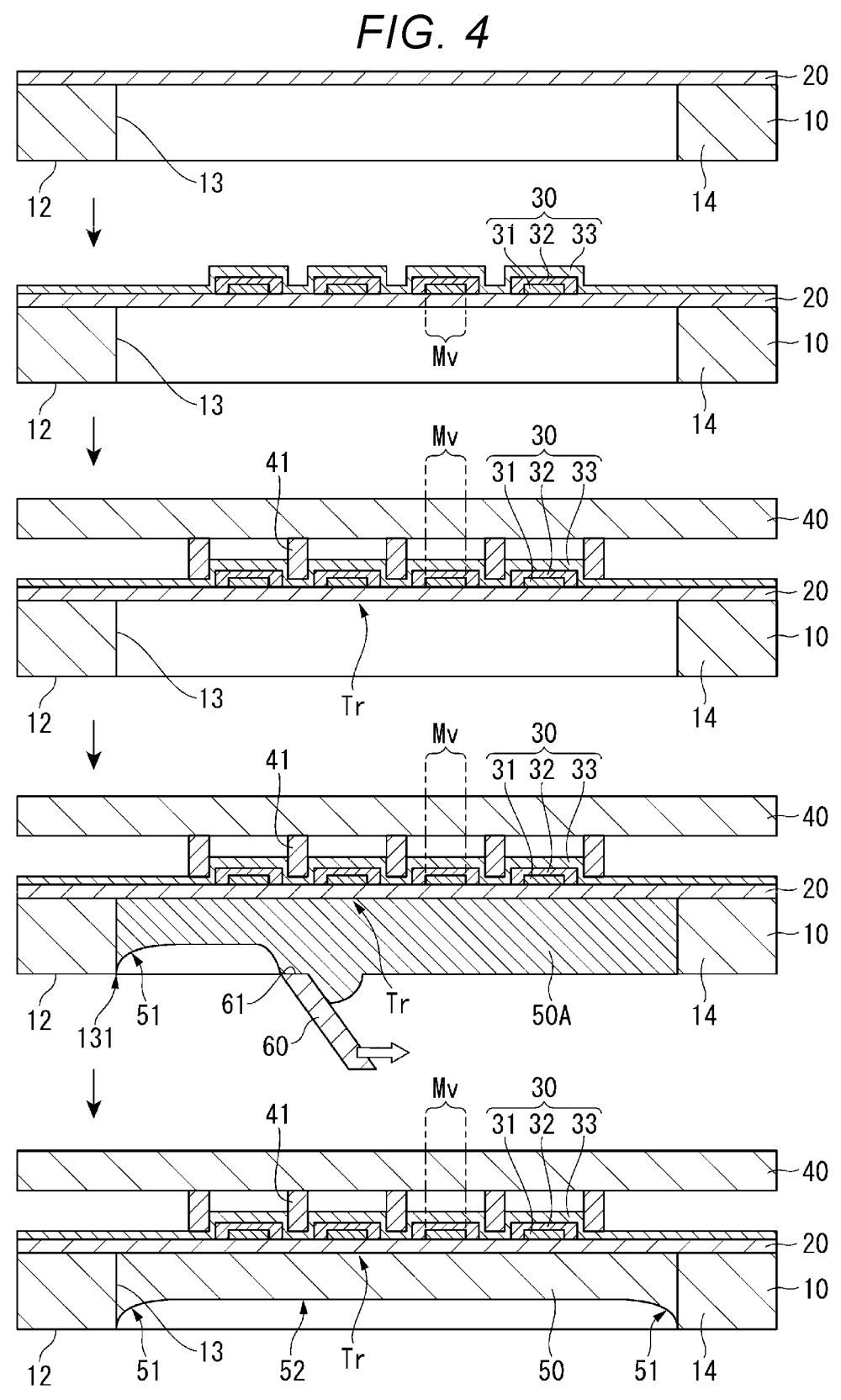

FIG. 4 is a diagram showing a method for manufacturing the ultrasonic sensor 1.

When the ultrasonic sensor 1 is manufactured, for example, an SOI substrate is formed by oxidizing one surface side of a Si substrate, and a Si layer is etched using a $SiO_2$ layer as an etching stopper, thereby forming the substrate 10 having the opening 13.

For example, a $ZrO_2$ layer is formed at a side of the $SiO_2$ layer opposite from the substrate 10 (Si layer), thereby forming the vibration plate 20 including the $SiO_2$ layer and the $ZrO_2$ layer as shown in a first part of FIG. 4.

An electrode layer is formed at a side of the vibration plate 20 opposite from the substrate 10, and the electrode layer is patterned by etching or the like to form the first electrode 31. Thereafter, a piezoelectric film is formed and patterned by etching or the like to form the piezoelectric layer 32. Further, an electrode layer is formed again, and patterning is performed using etching or the like to form the second electrode 33. Accordingly, the piezoelectric elements 30 are formed as shown in a second part of FIG. 4.

Thereafter, a resin layer (for example, resist) for forming the partition walls 41 is formed at a surface of the vibration plate 20 at an opposite side from the substrate 10, the partition walls 41 are formed by patterning the resin layer, and the sealing plate 40 is bonded via the partition walls 41. Accordingly, as shown in a third part of FIG. 4, the sealing plate 40 is bonded via the partition walls 41, and the ultrasonic transducers Tr are formed.

Thereafter, the elastic layer 50 is formed in the opening 13.

In the formation of the elastic layer 50, a resin material 50A for forming the elastic layer 50 is injected from a nozzle into the opening 13 to fill the opening 13.

A spatula member 60 having a leveling surface 61 parallel to the second surface 12 of the substrate 10 is brought into contact with the second surface 12, and the spatula member 60 is reciprocated in both directions along the X direction of the second surface 12 at a predetermined constant speed as shown in a fourth part of FIG. 4. Similarly, the spatula member 60 is reciprocated in both directions along the Y direction of the second surface 12.

At this time, from the opening end edge 131 of the opening 13 to a position having the predetermined dimension a corresponding to a moving speed of the spatula member 60, a curved surface which is convex from a height position of the second surface 12 toward the vibration plate 20 side is formed, the outer peripheral edge portion 51 is formed, and the thickness at the central portion 52 on an inner side of the outer peripheral edge portion 51 becomes uniform. In this way, the ultrasonic sensor 1 is manufactured.

Figure 5:
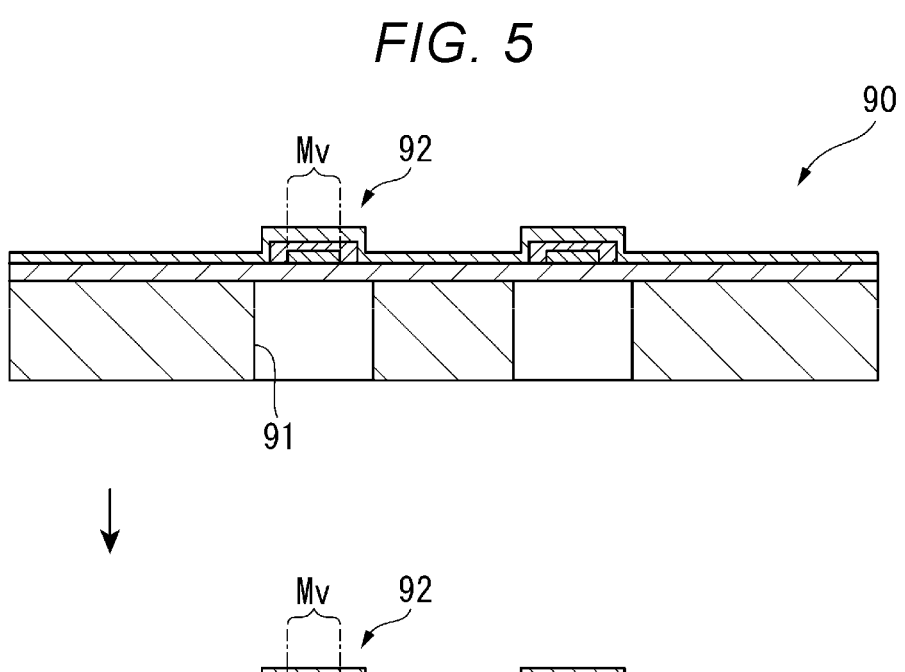
FIG. 5 is a diagram showing a case where an elastic layer is formed in an ultrasonic sensor according to a comparative example.
Figure 5:
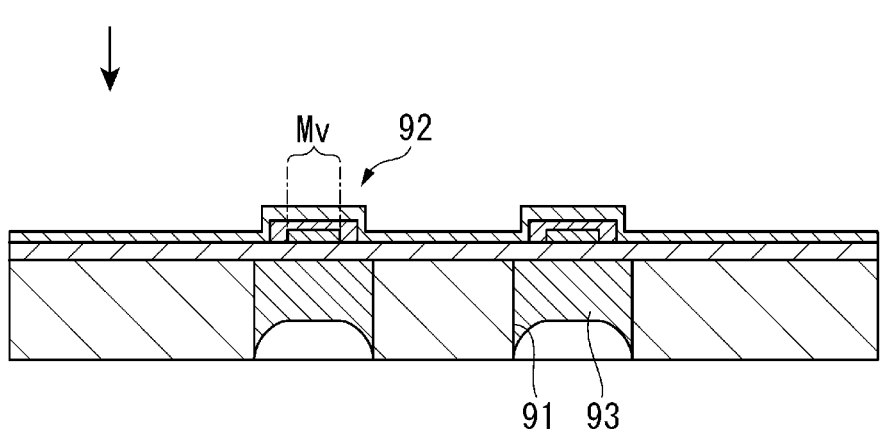

Here, the formation of the elastic layer will be described using an ultrasonic sensor in the related art in which one active portion is provided in one opening as a comparative example. FIG. 5 is a diagram showing a case where an elastic layer 93 is formed in an ultrasonic sensor 90 according to the comparative example.

In the ultrasonic sensor 90 according to the comparative example, as shown in a first part of FIG. 5, each opening 91 has a size corresponding to one active portion Mv, and one piezoelectric element 92 is disposed in the opening 91. In this case, in order to form the elastic layer 93, since a thickness of the elastic layer cannot be made uniform only by injecting the resin material 50A into the opening, as shown in a second part of FIG. 5, the elastic layer is leveled using the spatula member 60. However, since the opening 91 is small, a creep-up portion of the elastic layer 93 overlaps the active portion Mv, and as shown in a third part of FIG. 5, the thickness of the elastic layer 93 facing the active portion Mv cannot be made uniform.

Figure 6:
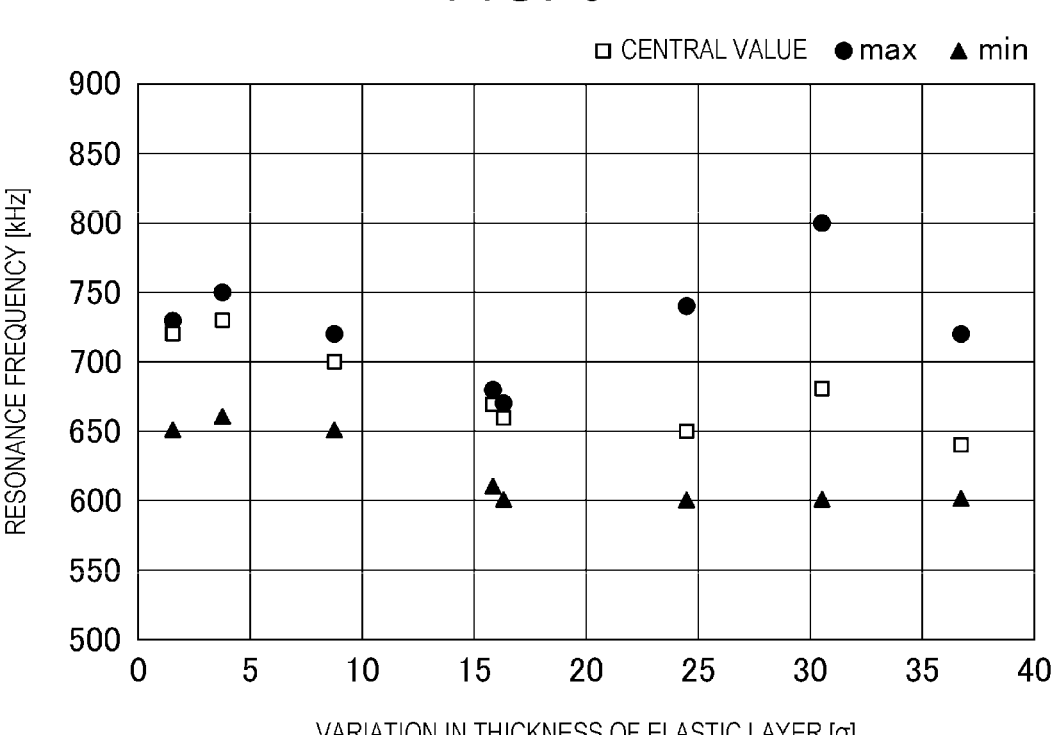
FIG. 6 is a diagram showing a relation between variation in the thickness of the elastic layer and the resonance frequency of the ultrasonic transducer.

FIG. 6 is a diagram showing a relation between variation in the thickness of the elastic layer and the resonance frequency of the ultrasonic transducer.

When variation σ of the thickness of the elastic layer satisfies σ<20, as shown in FIG. 6, the variation in the resonance frequency in the ultrasonic transducer Tr is also small, and is 600 kHz to 750 kHz as in the range $F_1$ shown in FIG. 3. In contrast, when the variation σ of the elastic layer satisfies σ≥20, the variation in the resonance frequency is also large.

In the ultrasonic sensor 90 in the related art as shown in the comparative example, as described above, the thickness of the elastic layer 93 facing the active portion Mv becomes non-uniform, σ<20 cannot be achieved, and the variation in the resonance frequency also becomes large.

In contrast, in the embodiment, a plurality of active portions Mv are arranged with respect to one opening 13, and a shape of the flexible portion 21 is defined by the partition wall 41, so that the opening area of the opening 13 can be large. Therefore, as described above, by using the spatula member 60, it is possible to form the elastic layer 50 in which the thickness of the central portion 52 is uniform, and it is possible to achieve σ<20. Accordingly, the ultrasonic sensor 1 having high transmission and reception sensitivity can be manufactured.

In the embodiment, when the thickness of the elastic layer 50 is less than half the thickness of the substrate 10, the thickness cannot be accurately and uniformly leveled either using the spatula member 60 as shown in FIG. 4. That is, variation occurs in the thickness of the elastic layer 50, σ<20 cannot be achieved, and as a result, as shown in FIG. 3, variation occurs in the resonance frequency of the ultrasonic transducer Tr. As a result, the transmission and reception sensitivity for the ultrasonic wave of the ultrasonic sensor 1 is lowered.

In this regard, when the thickness of the elastic layer 50 is equal to or larger than half the thickness of the substrate and less than the thickness of the substrate, the thickness of the elastic layer 50 at the central portion 52 can be controlled by the moving speed of the spatula member 60. Accordingly, as shown in FIG. 3, it is possible to reduce variation in the resonance frequency of the ultrasonic transducer Tr, and it is possible to provide the ultrasonic sensor 1 having high transmission and reception sensitivity.

Functions and Effects of Embodiment

The ultrasonic sensor 1 according to the embodiment includes the substrate 10, the vibration plate 20, the piezoelectric elements 30, and the elastic layer 50. The substrate 10 has the first surface 11 and the second surface 12, and includes the opening 13 extending from the first surface 11 to the second surface 12. The vibration plate 20 closes a first surface 11 side of the opening 13. The piezoelectric elements 30 are provided at a surface of the vibration plate 20 at an opposite side from the opening 13, and each include the first electrode 31, the piezoelectric layer 32, and the second electrode 33 which are stacked in a −Z direction. The elastic layer 50 is in contact with the vibration plate 20 in the opening 13. In the embodiment, a plurality of active portions Mv face one opening 13. The thickness of the elastic layer 50 is equal to or larger than half the thickness of the substrate 10 and less than the thickness of the substrate 10, and the thickness of the elastic layer 50 in each active portion Mv is uniform when viewed from a direction orthogonal to the Z direction.

Accordingly, in the embodiment, the resonance frequencies of the ultrasonic transducers Tr corresponding to the active portions Mv do not vary, and ultrasonic waves having uniform frequencies can be output from individual ultrasonic transducers Tr. When an ultrasonic wave is received by each ultrasonic transducer Tr, reception sensitivity for the ultrasonic wave with respect to the same frequency becomes uniform. Accordingly, it is possible to improve the transmission and reception sensitivity for the ultrasonic wave in the ultrasonic sensor 1.

In the ultrasonic sensor 1 according to the embodiment, a total area of regions in which the plurality of active portions Mv are arranged is smaller than the area of the opening 13 in the plan view. The total area of the plurality of the active portions facing the one opening occupies 60% to 80% of the area of the one opening in the plan view.

Thus, by arranging a large number of active portions Mv in one opening 13, it is possible to further reduce attenuation of the ultrasonic wave output from the ultrasonic sensor 1. Therefore, it is possible to implement the ultrasonic sensor 1 having higher efficiency of transmission and reception. Further, in the ultrasonic sensor in the related art (for example, the ultrasonic sensor 90 shown in the comparative example) in which one opening is provided for each active portion, since it is necessary to provide a large number of minute openings, a manufacturing process becomes complicated. However, in the embodiment, the opening can be large, and the ultrasonic sensor 1 excellent in mass productivity can be implemented.

In the embodiment, the elastic layer 50 includes the outer peripheral edge portion 51 provided from the opening end edge 131 of the opening 13 to a position at the inner side by the predetermined dimension a in the plan view, and the central portion 52 provided at a side farther from the opening end edge 131 than the outer peripheral edge portion 51, and the active portion Mv is provided at a position overlapping the central portion 52.

The outer peripheral edge portion 51 is a portion where the resin material 50A creeps up along the opening end edge 131 of the opening 13 when the elastic layer 50 is formed, and a shape of the surface at the opposite side from the vibration plate 20 is a curved surface. That is, the thickness of the elastic layer at the outer peripheral edge portion 51 is not uniform. In contrast, the central portion 52 is a portion having a uniform thickness, and by providing the active portion Mv overlapping the central portion 52, the ultrasonic sensor 1 having high transmission and reception sensitivity as described above can be implemented.

In the embodiment, the partition walls 41, which are the reduction portion for reducing vibration of the vibration plate 20, are provided at the surface of the vibration plate 20 at the opposite side from the opening 13 between the adjacent active portions Mv.

Accordingly, a plurality of ultrasonic transducers Tr can be defined in the opening 13, and ultrasonic transmission and reception processing in each ultrasonic transducer Tr becomes possible.

In the ultrasonic sensor 1 according to the embodiment, a plurality of active portions Mv are arranged along the X direction and the Y direction, and the partition walls 41 are provided between adjacent active portions Mv in the X direction and between adjacent active portions Mv in the Y direction.

That is, in the embodiment, the flexible portion 21 of each ultrasonic transducer Tr is formed by being surrounded in four directions by the partition walls 41. Accordingly, characteristics of each ultrasonic transducer Tr can be made uniform.

By arranging the active portions Mv in an array along the X direction and the Y direction, as described above, it is possible to arrange a large number of ultrasonic transducers Tr in one opening 13.

In the embodiment, the sealing plate 40 is provided at the side of the vibration plate 20 opposite from the substrate 10 and seals air around the piezoelectric element 30, and the partition walls 41 are coupled to the sealing plate 40.

In such a configuration, by coupling the partition walls 41 to the sealing plate 40 which is not affected by vibration of the vibration plate 20, vibration of the partition walls 41 in the Z direction due to the vibration of the vibration plate 20 can be reduced, and an effect of reducing vibration of the vibration plate 20 by the partition walls 41 can be enhanced.

The ultrasonic sensor 1 according to the embodiment is manufactured by injecting the resin material 50A forming the elastic layer 50 into the opening 13 of the substrate 10 in which the vibration plate 20 is provided at the first surface 11, and reciprocating the spatula member 60 having the leveling surface 61 parallel to the second surface 12 at a predetermined constant speed along the second surface 12 in a state where the spatula member 60 is in contact with the second surface 12.

Accordingly, the thickness of the central portion 52 of the elastic layer 50 can be made uniform, and the ultrasonic sensor 1 having high ultrasonic transmission and reception sensitivity for the ultrasonic wave as described above can be manufactured.

Modifications

The present disclosure is not limited to the above-described embodiment, and includes the following modifications as long as the object of the present disclosure can be achieved.

For example, in the above embodiment, a configuration is shown in which a plurality of active portions Mv are arranged along the X direction and the Y direction in the opening 13, but the present disclosure is not limited thereto. For example, a plurality of active portions Mv may be arranged only along the X direction in the opening 13, or a plurality of active portions Mv may be arranged only along the Y direction in the opening 13.

The ultrasonic sensor 1 may be provided with a plurality of openings 13 in which a plurality of active portions Mv are arranged.

In the above embodiment, a configuration is shown in which the total area of the active portions Mv is 60% to 80% with respect to the area of the opening 13, but the present disclosure is not limited thereto. For example, at the time of manufacturing the ultrasonic sensor 1, the dimension a of the outer peripheral edge portion 51 can be controlled by controlling the moving speed of the spatula member 60. Therefore, a larger number of active portions Mv may be arranged with respect to the opening 13.

In the above embodiment, as shown in FIG. 1, an example in which the partition wall 41 is disposed only in the central portion 52 is shown, but the partition wall 41 may extend to a position overlapping the outer peripheral edge portion 51 or the wall portion 14 in the plan view.

Alternatively, a material for the partition wall 41 formed of, for example, a resist may be formed at the entire surface of the vibration plate 20 at the opposite side from the substrate 10, and patterning may be performed so that the partition wall 41 for partitioning the plurality of flexible portions 21 is formed only in the region of the central portion 52. That is, a position overlapping the outer peripheral edge portion 51 and the wall portion 14 in the plan view may be bonded to the sealing plate 40 by a bonding layer made of the same material as the partition wall 41.

SUMMARY OF PRESENT DISCLOSURE

An ultrasonic sensor according to a first aspect of the present disclosure includes: a substrate having a first surface and a second surface at an opposite side from the first surface, the substrate having an opening extending from the first surface to the second surface; a vibration plate closing a first surface side of the opening; piezoelectric elements provided at a surface of the vibration plate at an opposite side from the opening and each including a first electrode, a piezoelectric layer, and a second electrode which are stacked; and an elastic layer in contact with the vibration plate in the opening, in which a direction in which the first electrode, the piezoelectric layer, and the second electrode are stacked is defined as a stacking direction, and a portion in which the first electrode, the piezoelectric layer, and the second electrode overlap in a plan view seen from the stacking direction is defined as an active portion, and a plurality of the active portions face the one opening, and a thickness of the elastic layer is equal to or larger than half a thickness of the substrate and less than the thickness of the substrate, and the thickness of the elastic layer in each of the active portions is uniform when viewed from a direction orthogonal to the stacking direction.

Accordingly, in the aspect, there is no variation in the resonance frequency in each active portion, and an ultrasonic wave having a uniform frequency can be output from each active portion. When ultrasonic waves are received by each active portion, reception sensitivity for the ultrasonic waves with respect to the same frequency becomes uniform. Therefore, it is possible to improve the transmission and reception sensitivity for the ultrasonic wave in the ultrasonic sensor.

In the ultrasonic sensor according to the aspect, an area of a region in which the plurality of active portions are arranged is smaller than an area of the opening in the plan view.

In the ultrasonic sensor according to the aspect, it is preferable that the total area of the plurality of the active portions facing the one opening occupies 60% to 80% of the area of the one opening in the plan view.

Accordingly, by arranging a large number of active portions in one opening, it is possible to further reduce attenuation of the ultrasonic wave output from the ultrasonic sensor.

In the ultrasonic sensor according to the aspect, the elastic layer includes an outer peripheral edge portion provided from an edge of the opening to a position at an inner side by a predetermined dimension, and a central portion provided at a side farther from the edge of the opening than the outer peripheral edge portion in the plan view, and the active portion is provided at a position overlapping the central portion when viewed from the stacking direction.

At the outer peripheral edge portion, when the elastic layer is formed, the resin material for forming the elastic layer creeps up along a wall surface of the opening. Therefore, a shape of the surface of the outer peripheral edge portion at an opposite side from the vibration plate is a curved surface, and the thickness of the elastic layer is not uniform. In this regard, the central portion is a portion having a uniform thickness, and by providing the active portion overlapping the central portion, the ultrasonic sensor having high transmission and reception sensitivity as described above can be implemented.

In the ultrasonic sensor according to the aspect, a reduction portion configured to reduce vibration of the vibration plate is provided at the surface of the vibration plate at the opposite side from the opening between adjacent active portions.

Accordingly, the vibration plate is divided into a plurality of regions surrounded by the reduction portion, and the active portion is disposed in each of the divided regions. In such a configuration, one ultrasonic transducer is implemented by one region and an active portion disposed in the region, and transmission and reception processing of ultrasonic waves can be performed by the ultrasonic transducer.

In the ultrasonic sensor according to the aspect, a direction orthogonal to the stacking direction is defined as a first direction, a direction orthogonal to the stacking direction and the first direction is defined as a second direction, a plurality of active portions facing the one opening are arranged along the first direction and the second direction, and the reduction portion is provided between adjacent active portions in the first direction and between adjacent active portions in the second direction.

In the aspect, by arranging the active portions in an array along the first direction and the second direction, as described above, a large number of active portions can be provided in one opening, and attenuation of the ultrasonic wave output from the ultrasonic sensor can be further reduced.

The ultrasonic sensor according to the aspect further includes: a sealing plate disposed at a side of the vibration plate opposite from the substrate and sealing air around the piezoelectric elements, in which the reduction portion is coupled to the sealing plate.

By coupling each reduction portion to the sealing plate in this manner, vibration of each reduction portion is restricted by the sealing plate. Therefore, it is possible to reduce vibration of the entire vibration plate, and it is possible to individually vibrate regions in the vibration plate, which are partitioned by the reduction portion and in which the active portion is disposed.

A method for manufacturing an ultrasonic sensor according to a second aspect of the present disclosure is a method for manufacturing an ultrasonic sensor, the ultrasonic sensor including a substrate having a first surface and a second surface at an opposite side from the first surface, the substrate having an opening extending from the first surface to the second surface, a vibration plate closing a first surface side of the opening, piezoelectric elements provided at a surface of the vibration plate at an opposite side from the opening and each including a first electrode, a piezoelectric layer, and a second electrode stacked, and an elastic layer in contact with the vibration plate in the opening, in which a direction in which the first electrode, the piezoelectric layer, and the second electrode are stacked is defined as a stacking direction, and a portion in which the first electrode, the piezoelectric layer, and the second electrode overlap in a plan view seen from the stacking direction is defined as an active portion, and a plurality of the active portions face the one opening, and a thickness of the elastic layer is equal to or larger than half a thickness of the substrate and less than the thickness of the substrate, and the thickness of the elastic layer in each of the active portions is uniform when viewed from a direction orthogonal to the stacking direction. The method for manufacturing an ultrasonic sensor includes: injecting a resin material for forming the elastic layer into the opening of the substrate at which the vibration plate is provided at the first surface; bringing a spatula member having a leveling surface parallel to the second surface into contact with the second surface; and reciprocating the spatula member along the second surface at a predetermined constant speed.

Thus, by leveling the resin material injected into the opening with the leveling surface of the spatula member, the thickness of the elastic layer in the opening can be equal to or larger than half the thickness of the substrate and less than the thickness of the substrate, and the surface of the elastic layer can be made flat to form the elastic layer having a uniform thickness.

What is claimed is:

1. An ultrasonic sensor comprising:
a substrate having a first surface and a second surface at an opposite side from the first surface, the substrate having an opening penetrating the substrate from the first surface to the second surface;
a vibration plate covering a first surface side of the opening;
a plurality of piezoelectric elements provided at a surface of the vibration plate at an opposite side from the opening and each including a first electrode, a piezoelectric layer, and a second electrode which are stacked; and
an elastic layer in contact with the vibration plate in the opening, wherein
a direction in which the first electrode, the piezoelectric layer, and the second electrode are stacked is defined as a stacking direction, a portion in which the first electrode, the piezoelectric layer, and the second electrode overlap in a plan view seen from the stacking direction is defined as an active portion, and a plurality of active portions face the opening, and
a thickness of the elastic layer is equal to or larger than half a thickness of the substrate and less than the thickness of the substrate, and the thickness of the elastic layer in each of the plurality of active portions is uniform when viewed from a direction orthogonal to the stacking direction.

2. The ultrasonic sensor according to claim 1, wherein an area of a region in which the plurality of active portions are arranged is smaller than an area of the opening in the plan view.

3. The ultrasonic sensor according to claim 2, wherein the elastic layer includes an outer peripheral edge portion provided from an edge of the opening to a position at an inner side by a predetermined dimension, and a central portion provided at a side farther from the edge of the opening than the outer peripheral edge portion in the plan view, and
the active portion is provided at a position overlapping the central portion when viewed from the stacking direction.

4. The ultrasonic sensor according to claim 2, wherein a total area of the plurality of active portions facing the opening occupies 60% to 80% of the area of the opening in the plan view.

5. The ultrasonic sensor according to claim 1, wherein a reduction portion configured to reduce vibration of the vibration plate is provided at the surface of the vibration plate at the opposite side from the opening between adjacent active portions of the plurality of active portions.

6. The ultrasonic sensor according to claim 5, wherein the direction orthogonal to the stacking direction is defined as a first direction, a direction orthogonal to the stacking direction and the first direction is defined as a second direction, the plurality of active portions facing the opening are arranged along the first direction and the second direction, and the reduction portion is provided between adjacent active portions of the plurality of active portions in the first direction and between adjacent active portions of the plurality of active portions in the second direction.

7. The ultrasonic sensor according to claim 5, further comprising:
a sealing plate disposed at a side of the vibration plate opposite from the substrate and sealing air around the plurality of piezoelectric elements, wherein
the reduction portion is coupled to the sealing plate.

* * * * *